United States Patent [19]
Sato et al.

[11] Patent Number: 5,708,599
[45] Date of Patent: Jan. 13, 1998

[54] SEMICONDUCTOR MEMORY DEVICE CAPABLE OF REDUCING POWER CONSUMPTION

[75] Inventors: Hirotoshi Sato; Kunihiko Kozaru, both of Hyogo, Japan

[73] Assignee: Mitsubishi Denki Kabushiki Kaisha, Tokyo, Japan

[21] Appl. No.: 691,151

[22] Filed: Aug. 1, 1996

[30] Foreign Application Priority Data

Apr. 11, 1996 [JP] Japan ................... 8-089380

[51] Int. Cl.[6] ............................... G11C 11/00
[52] U.S. Cl. ...................... 365/154; 365/189.09
[58] Field of Search ........................ 365/154, 226, 365/189.09

[56] References Cited

FOREIGN PATENT DOCUMENTS 61-168195   7/1986   Japan .

Primary Examiner—David C. Nelms
Assistant Examiner—F. Niranjan
Attorney, Agent, or Firm—Lowe, Price, LeBlanc & Becker

[57] ABSTRACT

A reference voltage generated in a Vref1 generating circuit is supplied from a corresponding applied voltage selector to respective backgates of access transistors in each SRAM cell constituting a column which is selected by a column decoder. On the other hand, a substrate voltage generated in a Vbb generating circuit is supplied from a corresponding applied voltage selector to respective backgates of access transistors in each SRAM cell constituting a column which is not selected by the column decoder.

13 Claims, 18 Drawing Sheets

5,708,599

SEMICONDUCTOR MEMORY DEVICE CAPABLE OF REDUCING POWER CONSUMPTION

BACKGROUND OF THE INVENTION

1. Field of the Invention

The present invention relates to a semiconductor memory device, and more particularly, to a semiconductor memory device having a static random access memory (SRAM).

2. Description of the Background Art

FIG. 18 is a diagram showing a structure of a conventional semiconductor memory device having an SRAM cell array. Nine SRAM cell regions of the SRAM cell array are shown each connected to corresponding one of three word lines XSELm−1 to XSELm+1 (where m is an integer) in the row direction and connected to corresponding one of three bit line pairs respectively corresponding to three column select lines YSELn−1 to YSELn+1 (where n is an integer) in the column direction.

In this figure, if a word line XSELm and a column select line YSELn are selected by a row decoder 1 and a column decoder 2, respectively, for example, data is read or written from or to an SRAM cell 4.

FIG. 19 is a circuit diagram showing a circuit structure of a single SRAM cell constituting the SRAM cell array of FIG. 18. As shown in FIG. 19, in the conventional SRAM cell, respective backgate nodes of access transistors 6 and driver transistors 8 are connected to a ground node.

FIG. 20 is a diagram showing a state of a single SRAM cell at the time when a corresponding word line is in a non-selected state in the semiconductor memory device of FIG. 18, and FIG. 21 is a diagram showing transmission characteristics in the case of the state of FIG. 20.

As shown in FIG. 20, since access transistors 6 are off when the corresponding word line is in a non-selected state, each of two inverters of the SRAM cell is constituted by a single driver transistor 8 and a single high resistance 10 having high impedance, and has a high gain. In other words, as shown in FIG. 21, the slope of a transition part of an output of the inverter is large. At this time, a static noise margin (SNM) indicating the size of a portion surrounded by two characteristic curves of the SRAM cell is very large, and data is retained stably. It is noted that each of references S1 and S2 represents a stable point.

On the other hand, FIG. 22 is a diagram showing a state of a single SRAM cell at the time when a corresponding word line is in a selected state (when data is read) in the semiconductor memory device of FIG. 18, and FIG. 23 is a diagram showing transmission characteristics in the case of the state of FIG. 22. As shown in FIG. 22, when data is read from the SRAM cell, two access transistors 6 thereof are turned on, and column current flows into one of storage nodes (a node N1 or a node N2) which is at a low level. More specifically, this is equivalent to the fact that a high resistance having low impedance is connected in parallel to high resistance 10, which means that there is no high resistance 10 having high impedance. In addition, as shown in FIG. 23, a gain of the inverter is significantly reduced compared to that obtained at the time when a word line is in a non-selected state (the slope of a transition part of the output of the inverter becomes smaller). In this condition, a static noise margin is small and the SRAM cell is in the most unstable state, and therefore, the SRAM cell loses its bistable state, so that data might be destroyed.

In an SRAM cell array, if a voltage is boosted to activate a single word line at the time of reading data, not only data is read from a desired cell but also unnecessary column current flows into an SRAM cell in a non-selected column, and therefore, the SRAM cell in the non-selected column loses its bistable state, so that storage data therein might be unstable.

SUMMARY OF THE INVENTION

It is an object of the present invention to provide a semiconductor memory device having SRAM cells and capable of reducing power consumption and retaining data more stably by reducing column current at the time of reading data.

A semiconductor memory device in accordance with one aspect of the present invention includes a static memory cell array having a plurality of columns, a column selecting circuit for selecting a column from the static memory cell array, from or to which data is to be read or written, a substrate voltage generating circuit for generating a substrate voltage, a reference voltage generating circuit for generating a reference voltage, and a voltage supplying circuit. In this case, the voltage supplying circuit supplies a reference voltage to a backgate of an access transistor in each static memory cell constituting a column which is selected by the column selecting circuit, and supplies a substrate voltage to a backgate of an access transistor in each static memory cell constituting a column which is not selected by the column selecting circuit.

Accordingly, a primary advantage of the present invention is that column current flowing in each static memory cell in a non-selected column is reduced by supplying a substrate voltage to a backgate of an access transistor in each static memory cell constituting the non-selected column, resulting in achievement of both reduction in power consumption and stabilization of data retention in a semiconductor memory device having static memory cells.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will now be described in detail with reference to the accompanying drawings. It is noted that the same or a corresponding portion is denoted by the same reference in the figures.

[First Embodiment]

Figure 1:
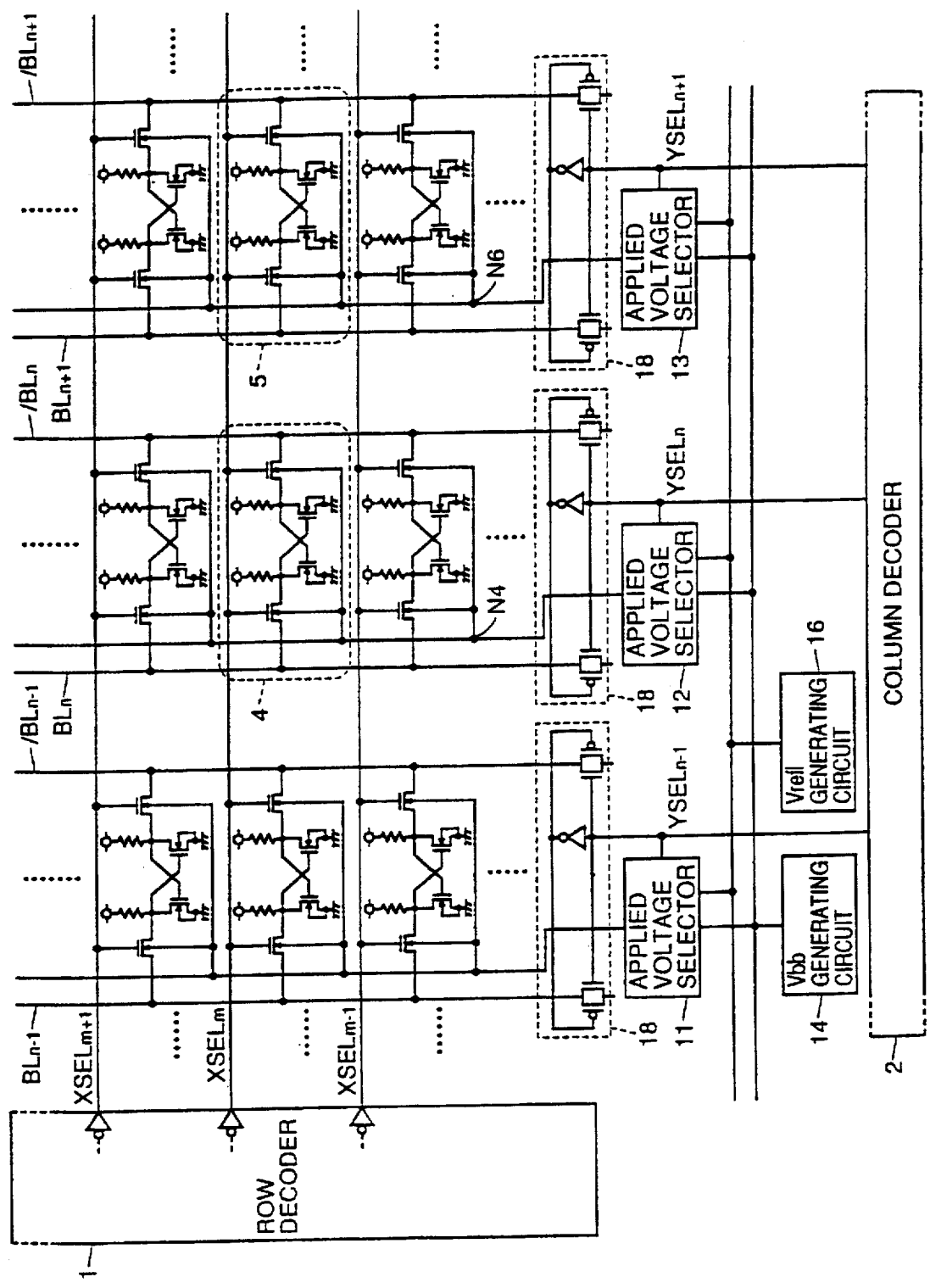
FIG. 1 is a diagram showing a structure of a semiconductor memory device in accordance with a first embodiment of the present invention.

FIG. 1 is a diagram showing a structure of a semiconductor memory device in accordance with a first embodiment of the present invention. As shown in FIG. 1, the semiconductor memory device of the first embodiment includes a plurality of word lines XSELs; a plurality of bit line pairs BLs and /BLs intersecting the word lines; a plurality of SRAM cells each connected to corresponding one of the word lines XSELs and to corresponding one of the bit line pairs BLs and /BLs; a row decoder 1 responsive to an input row address signal for selecting a word line; a column decoder 2 responsive to an input column address signal for generating a column selection signal; a plurality of column select lines YSELs connecting column decoder 2 to respective column select gates 18 and respective applied voltage selectors 11, 12 and 13; a plurality of column select gates 18 provided corresponding to respective bit line pairs and responsive to reception of the column selection signal being activated from column decoder 2 through respective column select lines for being turned on; a Vbb generating circuit 14 for generating a substrate voltage (Vbb); a Vref1 generating circuit 16 for generating a reference voltage (Vref1); and a plurality of applied voltage selectors 11, 12 and 13 provided corresponding to respective bit line pairs for outputting a reference voltage Vref1 applied from Vref1 generating circuit 16 when the column selection signal input from column decoder 2 through a corresponding column select line is activated and for outputting a substrate voltage Vbb applied from Vbb generating circuit 14 when the column selection signal input from column decoder 2 through a corresponding column select line is deactivated. In this case, each of applied voltage selectors 11, 12 and 13 is connected to a backgate of each access transistor in each SRAM cell constituting a corresponding column.

Figure 2:
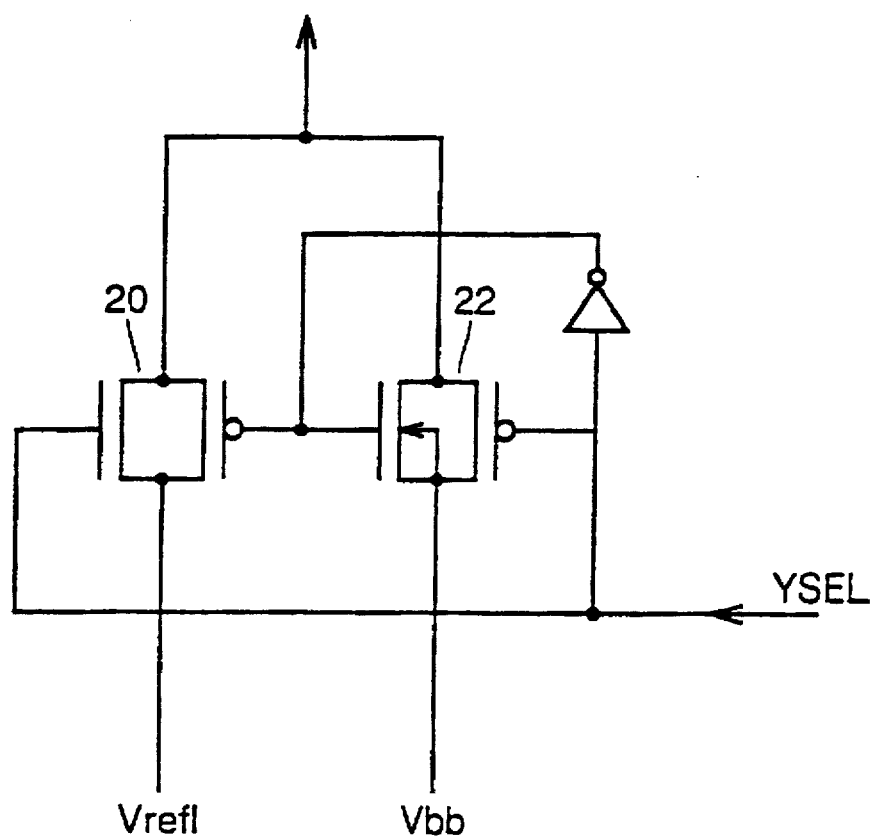
FIG. 2 is a circuit diagram showing one example of a specific structure of an applied voltage selector shown in FIG. 1.

FIG. 2 is a circuit diagram showing one example of a specific structure of one of applied voltage selectors 11, 12 and 13. As shown in FIG. 2, the applied voltage selector is provided with a first transfer gate 20 and a second transfer gate 22, and each of transfer gates 20 and 22 includes an N channel MOS transistor and a P channel MOS transistor. In this case, a source node and a backgate of an N channel MOS transistor in transfer gate 22 are connected to each other. In this applied voltage selector, if an input column selection signal YSEL is at an active high level, transfer gate 22 is turned off and transfer gate 20 is turned on, whereby a reference voltage Vref1 is output. On the other hand, if the input column selection signal YSEL is at an inactive low level, transfer gate 20 is turned off and transfer gate 22 is turned on, whereby a substrate voltage Vbb is output.

Figure 3:
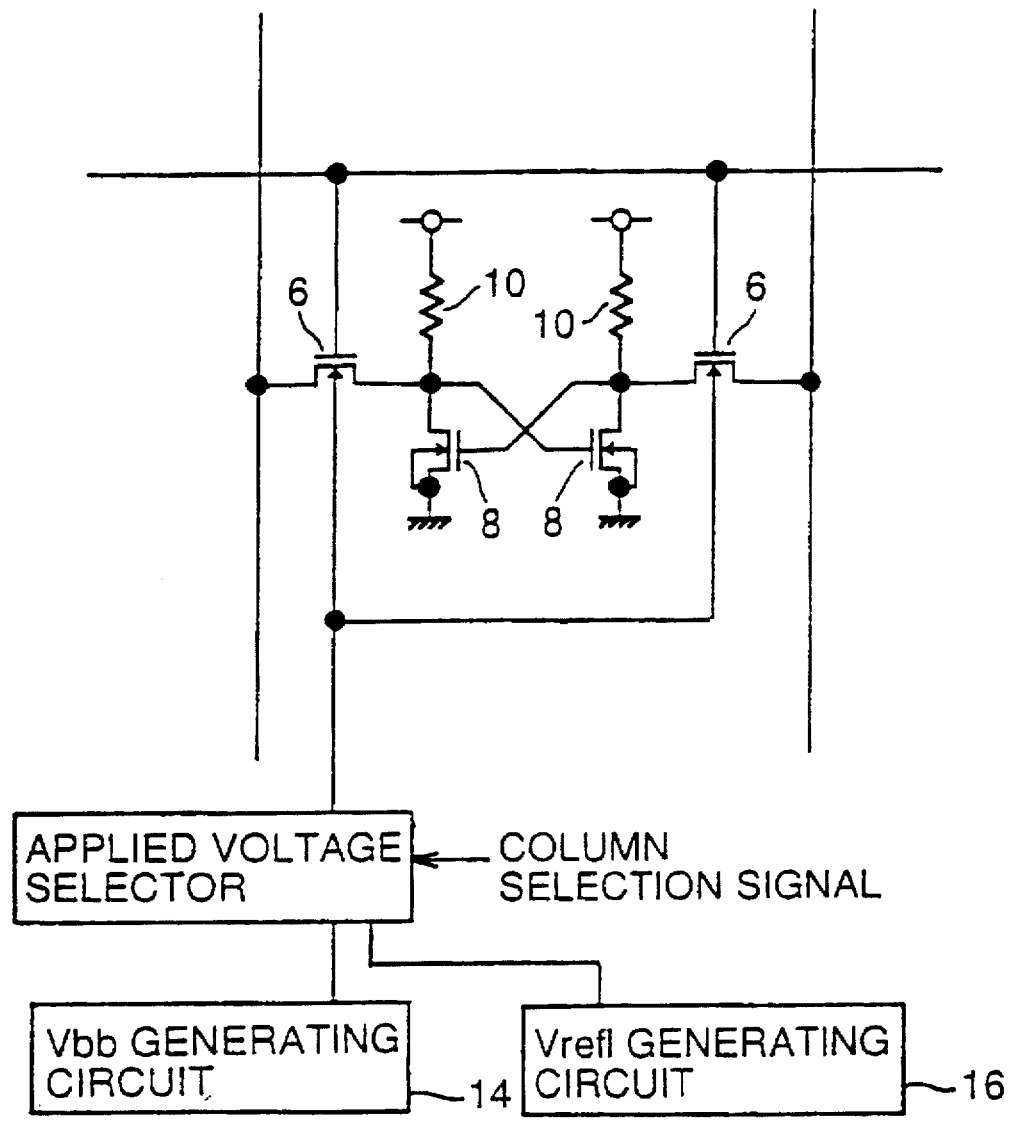
FIG. 3 is a diagram showing a single SRAM cell equivalent to that shown in FIG. 1.

FIG. 3 is a diagram showing a single SRAM cell equivalent to each SRAM cell constituting the SRAM cell array shown in FIG. 1. As shown in FIG. 3, each SRAM cell includes two high resistances 10, two driver transistors 8, and two access transistors 6. A reference voltage Vref1 generated in Vref1 generating circuit 16 is applied to a backgate of each access transistor 6 in each SRAM cell constituting a column selected by row decoder 2, and a substrate voltage Vbb generated in Vbb generating circuit 14 is applied to a backgate of each access transistor 6 in each SRAM cell constituting other columns. In this case, a potential of the substrate voltage Vbb is lower than that of the reference voltage Vref1, and therefore, a threshold voltage of access transistor 6 obtained when the substrate voltage Vbb is applied to the backgate of that access transistor 6 is higher than that obtained when the reference voltage Vref1 is applied thereto.

The operation of the semiconductor memory device in accordance with the first embodiment will now be described with reference to a timing chart of FIG. 4.

Figure 4:
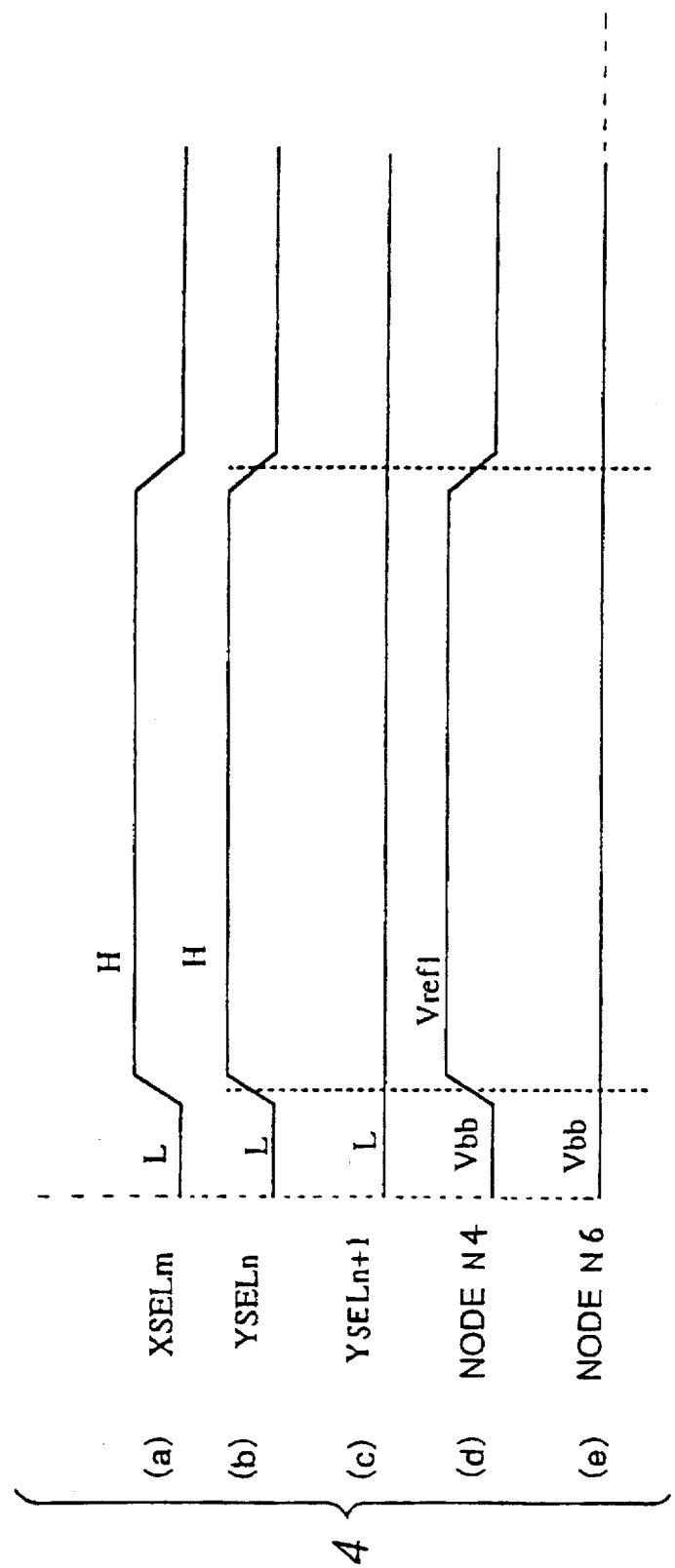
FIG. 4 is a timing chart illustrating the operation of the semiconductor memory device shown in FIG. 1.

If data is to be read from SRAM cell 4 connected to a word line XSELm and a bit line pair BLn and /BLn shown in FIG. 1, for example, the word line XSELm and a column select line YSELn are activated from a low level (L) to a high level (H) as shown in (a) and (b) of FIG. 4, respectively.

It is noted that a non-selected column select line YSELn+1, for example, is kept at an inactive L level at this time as shown in (c) of FIG. 4.

In addition, if the column select line YSELn is activated to an H level, a reference voltage Vref1 generated in Vref1 generating circuit 16 is output from applied voltage selector 12 shown in FIG. 1, and therefore, a potential on a node N4 shown in FIG. 1 becomes equal to a potential of the reference voltage Vref1 as shown in (d) of FIG. 4. More specifically, at this time, the reference voltage Vref1 is applied to a backgate of each access transistor 6 in each SRAM cell connected to the bit line pair BLn and /BLn.

On the other hand, since a potential on the non-selected column select line YSELn+i is at a low level as described above, a substrate voltage Vbb generated in Vbb generating circuit 14 is output from applied voltage selector 13 shown in FIG. 1, and therefore, a potential on a node N6 shown in FIG. 1 becomes equal to a potential of the substrate voltage Vbb as shown in (e) of FIG. 4. This means that the substrate voltage Vbb is applied to a backgate of each access transistor 6 of each SRAM cell in the non-selected column.

Thus, in accordance with the semiconductor memory device of the first embodiment, as a whole, a reference voltage Vref1 is applied to a backgate of each access transistor 6 of each SRAM cell in a selected column, thereby making normal data read operation possible, while a substrate voltage Vbb is applied to a backgate of each access transistor 6 of each SRAM cell in a non-selected column, thereby reducing unnecessary column current flowing into each SRAM cell in the non-selected column even if a word line is activated.

In the above description, Vbb generating circuit 14 generates a substrate voltage Vbb low enough to make a threshold voltage of access transistor 6 higher than a boosted voltage required to activate a word line. Furthermore, if such a substrate voltage Vbb is applied to a backgate of each access transistor 6 of each SRAM cell in the non-selected column, each access transistor 6 of each SRAM cell in the non-selected column can be completely turned off at the time of reading data, so that unnecessary column current can be completely prevented from flowing therein.

Figure 5:
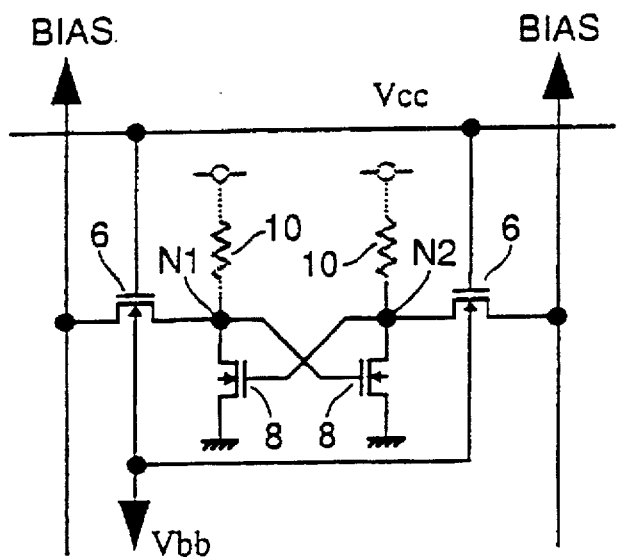
FIG. 5 is a diagram showing a state of an SRAM cell in a non-selected column at the time when a word line connected thereto is activated in the semiconductor memory device shown in FIG. 1.
Figure 6:
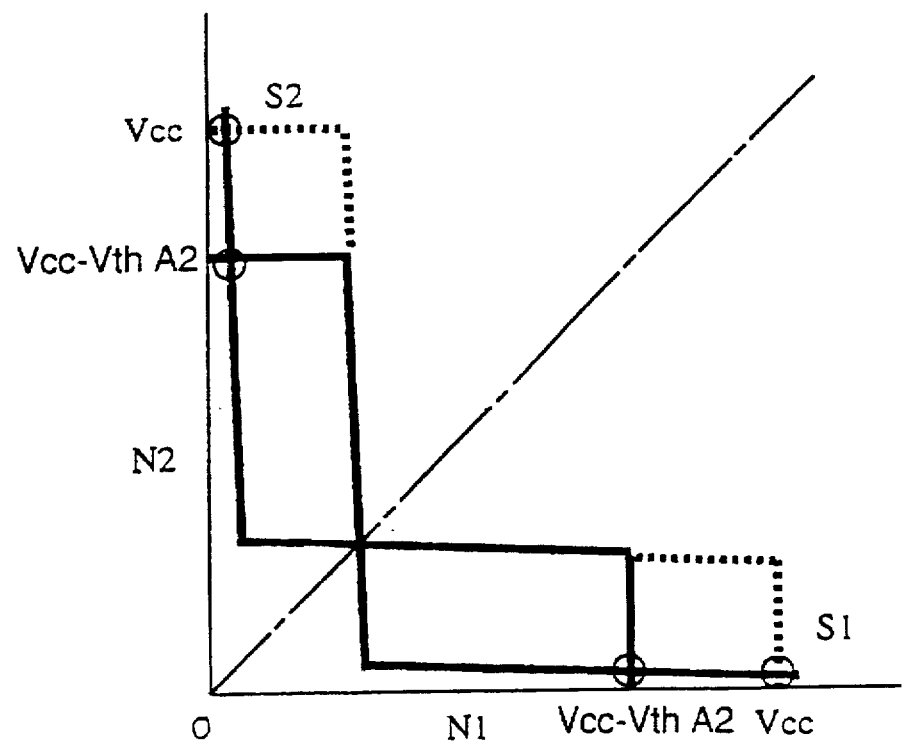
FIG. 6 is a diagram showing transmission characteristics of an SRAM cell being in the state shown in FIG. 5.

FIG. 5 is a diagram showing a state of an SRAM cell in a non-selected column at the time when a word line connected thereto is activated in accordance with the first embodiment of the present invention. As shown in FIG. 5, in this state, access transistor 6 has high impedance, and thus has a high gain. In addition, transmission characteristics in this state are shown by a solid line of FIG. 6. It can be seen that data in each SRAM cell in the non-selected column is retained stably since the slope of a transition part of an output of an inverter is large and a static noise margin is very large as shown in FIG. 6. It is noted that VthA2 indicates a threshold voltage of access transistor 6 at the time when a substrate voltage Vbb is applied to a backgate of that access transistor 6, and a broken line indicates transmission characteristics at the time when access transistor 6 is off, in FIG. 6.

Figure 7:
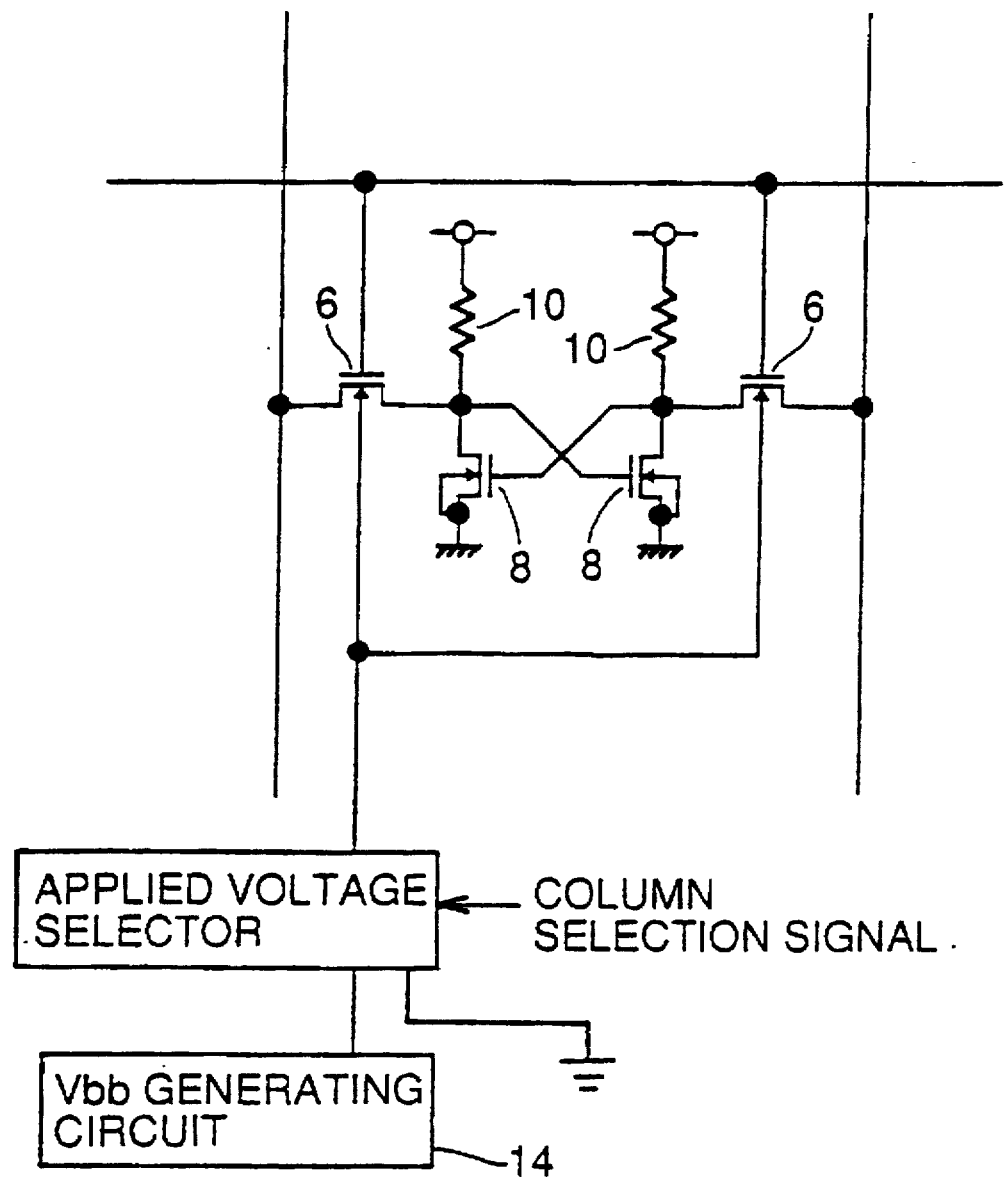
FIG. 7 is a diagram showing a structure of an SRAM cell using a ground voltage instead of a reference voltage Vref1 of FIG. 3.

Furthermore, although it is shown in the above description of the first embodiment that a substrate voltage Vbb or a reference voltage Vref1 is supplied to a backgate of each access transistor 6 of an SRAM cell, a ground voltage may be used instead of the reference voltage Vref1 as shown in FIG. 7 so long as a potential of the substrate voltage Vbb is lower than that of the ground voltage.

[Second Embodiment]

Figure 8:
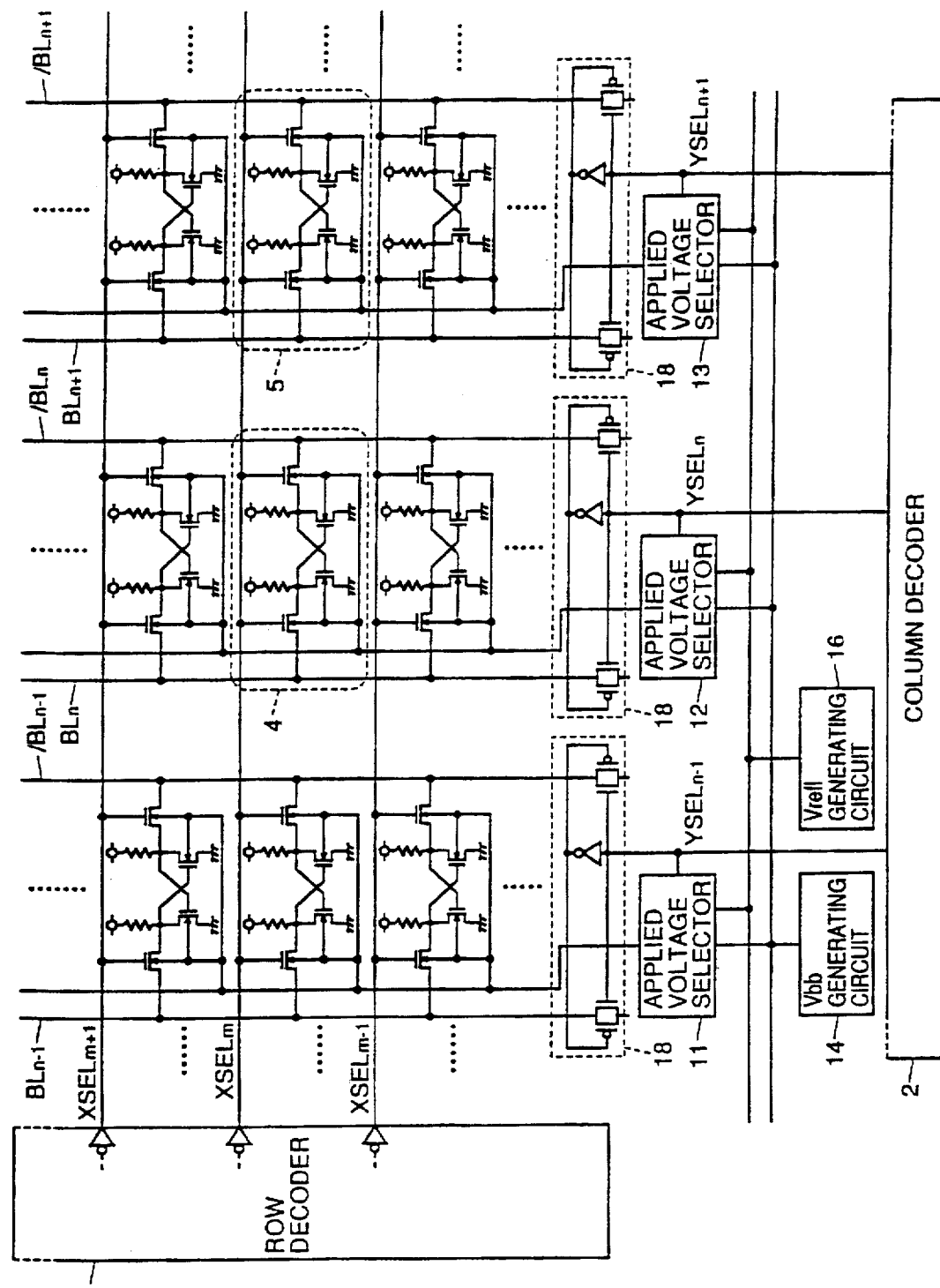
FIG. 8 is a diagram showing a structure of a semiconductor memory device in accordance with a second embodiment of the present invention.
Figure 9:
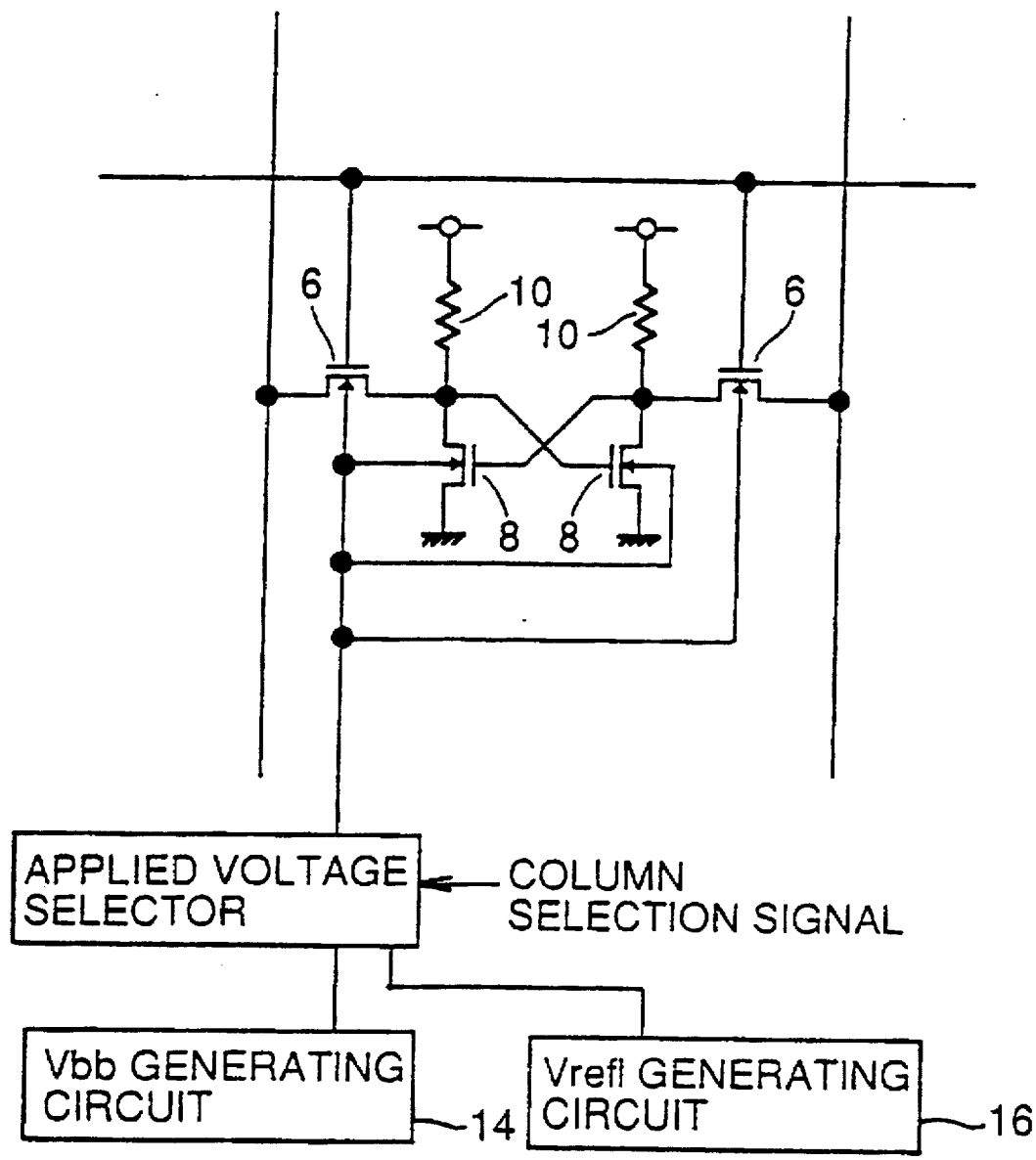
FIG. 9 is a diagram showing a single SRAM cell equivalent to that shown in FIG. 8.

FIG. 8 is a diagram showing a structure of a semiconductor memory device in accordance with a second embodiment of the present invention, and FIG. 9 is a diagram showing a single SRAM cell equivalent to each of SRAM cells constituting the SRAM cell array shown in FIG. 8.

As shown in these figures, the semiconductor memory device in accordance with the second embodiment of the present invention has a structure similar to that of the semiconductor memory device in accordance with the first embodiment shown in FIG. 1 except that each of applied voltage selectors 11, 12 and 13 is further connected to respective backgates of driver transistors 8 in SRAM cells in a corresponding column in the semiconductor memory device of the second embodiment.

In addition, the operation of the semiconductor memory device in accordance with the second embodiment is similar to that of the semiconductor memory device in accordance with the first embodiment, but as can be seen from the connection described above, an applied voltage selector to which a column selection signal at an active high level is supplied from a column decoder 2 supplies a reference voltage Vref1 to a backgate of each access transistor 6 and a backgate of each driver transistor 8 in SRAM cells in a selected column, while an applied voltage selector to which a column selection signal at an inactive low level is supplied from column decoder 2 supplies a substrate voltage Vbb to a backgate of each access transistor 6 and a backgate of each driver transistor 8 in SRAM cells in a non-selected column (where Vref1>Vbb).

Figure 10:
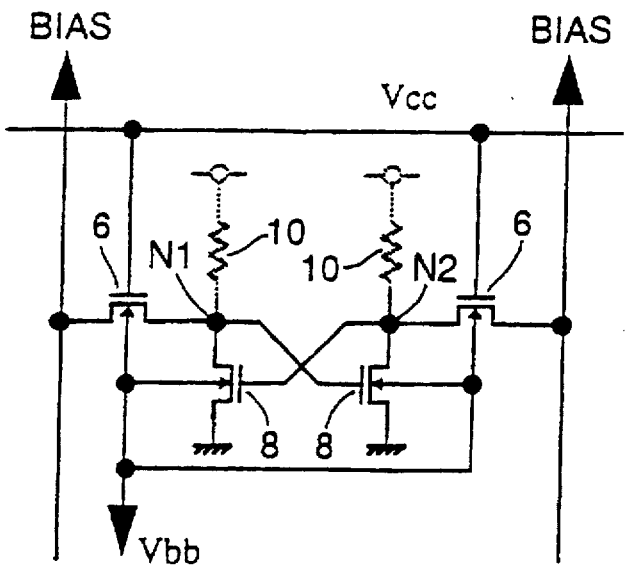
FIG. 10 is a diagram showing a state of an SRAM cell in a non-selected column at the time when a word line connected thereto is activated in the semiconductor memory device shown in FIG. 8.
Figure 11:
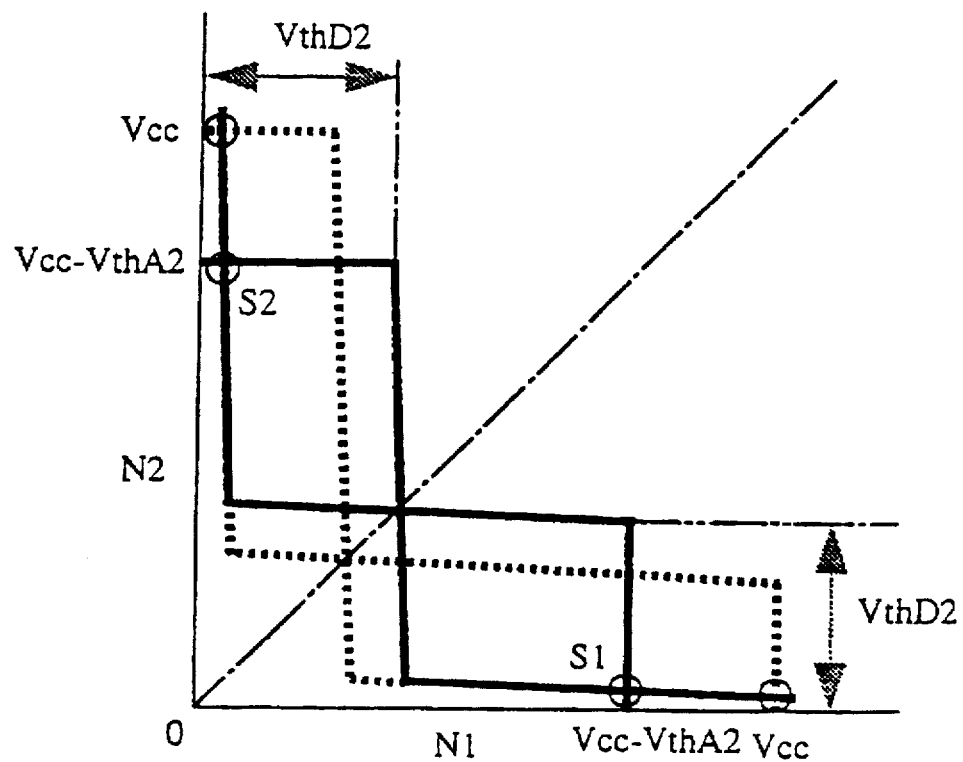
FIG. 11 is a diagram showing transmission characteristics of an SRAM cell being in the state shown in FIG. 10.

FIG. 10 is a diagram showing a state of an SRAM cell in a non-selected column at the time when a word line connected thereto is activated in accordance with the second embodiment of the present invention, and FIG. 11 is a diagram showing transmission characteristics in the state of FIG. 10.

As shown in FIG. 10, if a substrate voltage Vbb is applied to a backgate of driver transistor 8, a threshold voltage (VthD2) thereof is increased. Accordingly, as shown by a solid line of FIG. 11, this SRAM cell has characteristics similar to those of an SRAM cell in a similar case in accordance with the first embodiment, and further, the threshold voltage (VthD2) of driver transistor 8 is increased, whereby a static noise margin is increased, so that data can be retained more stably. It is noted that VthA2 represents a threshold voltage of access transistor 6 at the time when a substrate voltage Vbb is applied to a backgate thereof, and a broken line indicates transmission characteristics at the time when access transistor 6 is off, in FIG. 11.

Figure 12:
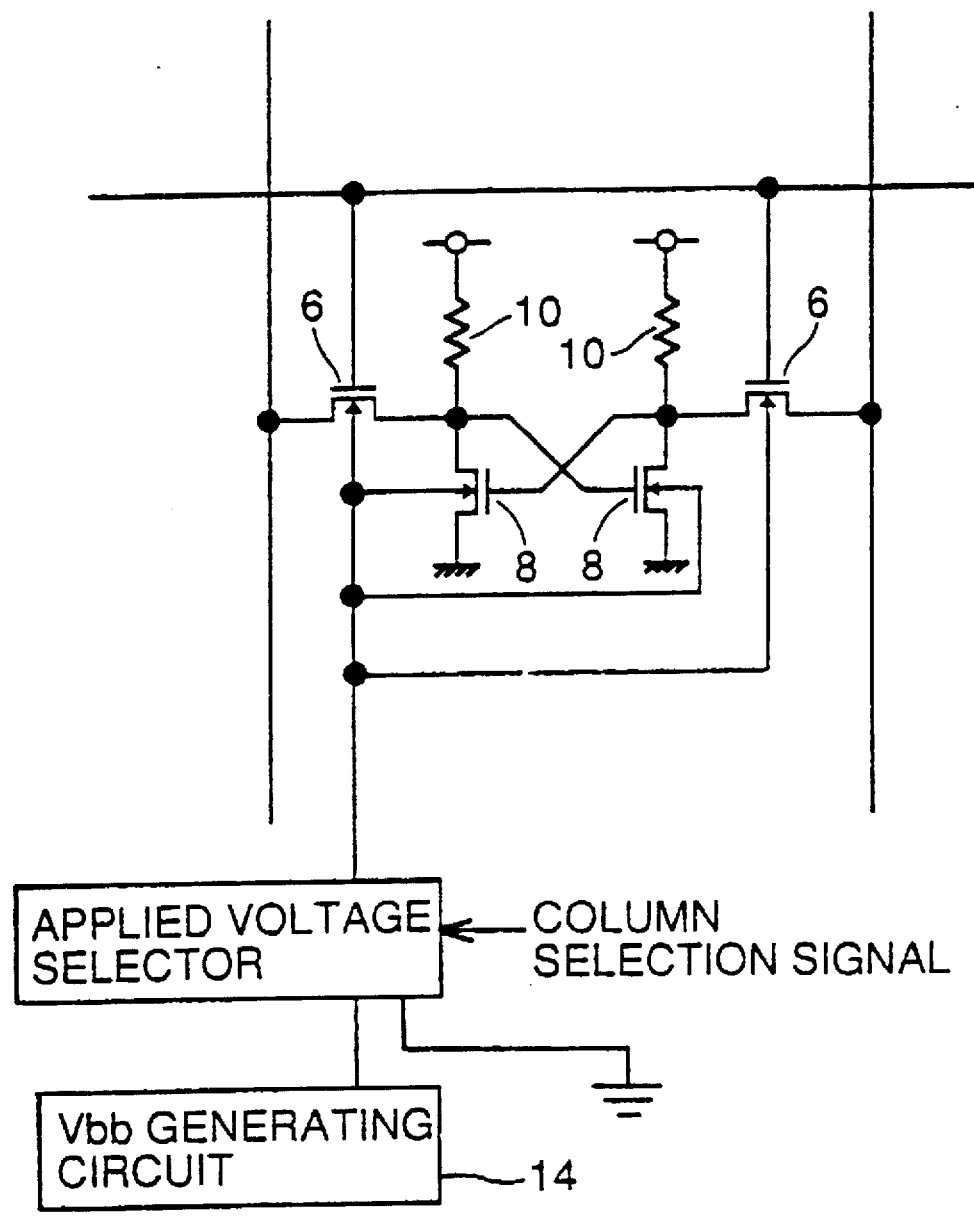
FIG. 12 is a diagram showing a structure of an SRAM cell using a ground voltage instead of a reference voltage Vref1 of FIG. 9.

Furthermore, as in the case of the first embodiment, a ground voltage may be used instead of a reference voltage Vref1 described in the second embodiment, as shown in FIG. 12.

[Third embodiment]

Figure 13:
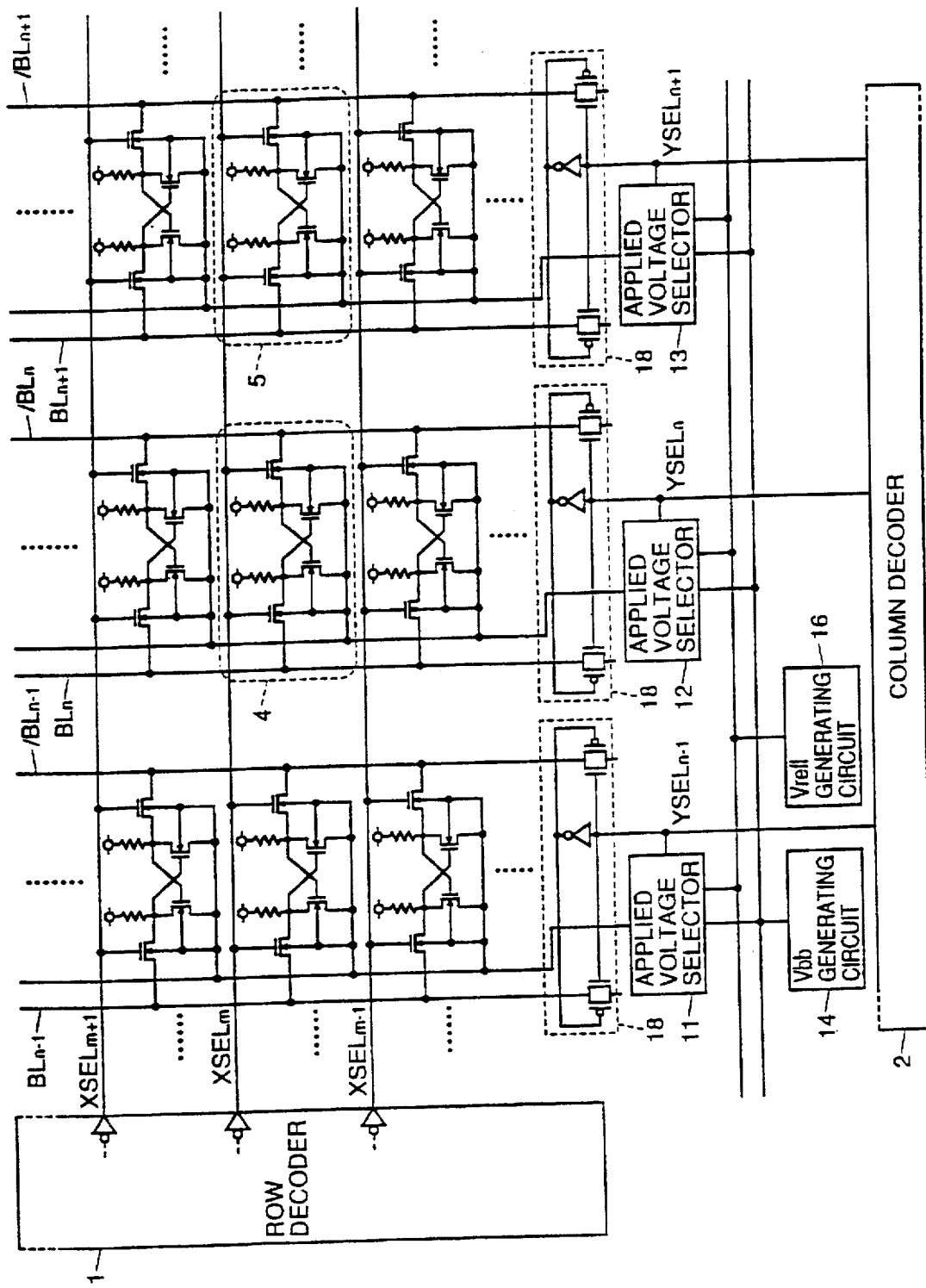
FIG. 13 is a diagram showing a structure of a semiconductor memory device in accordance with a third embodiment of the present invention.
Figure 14:
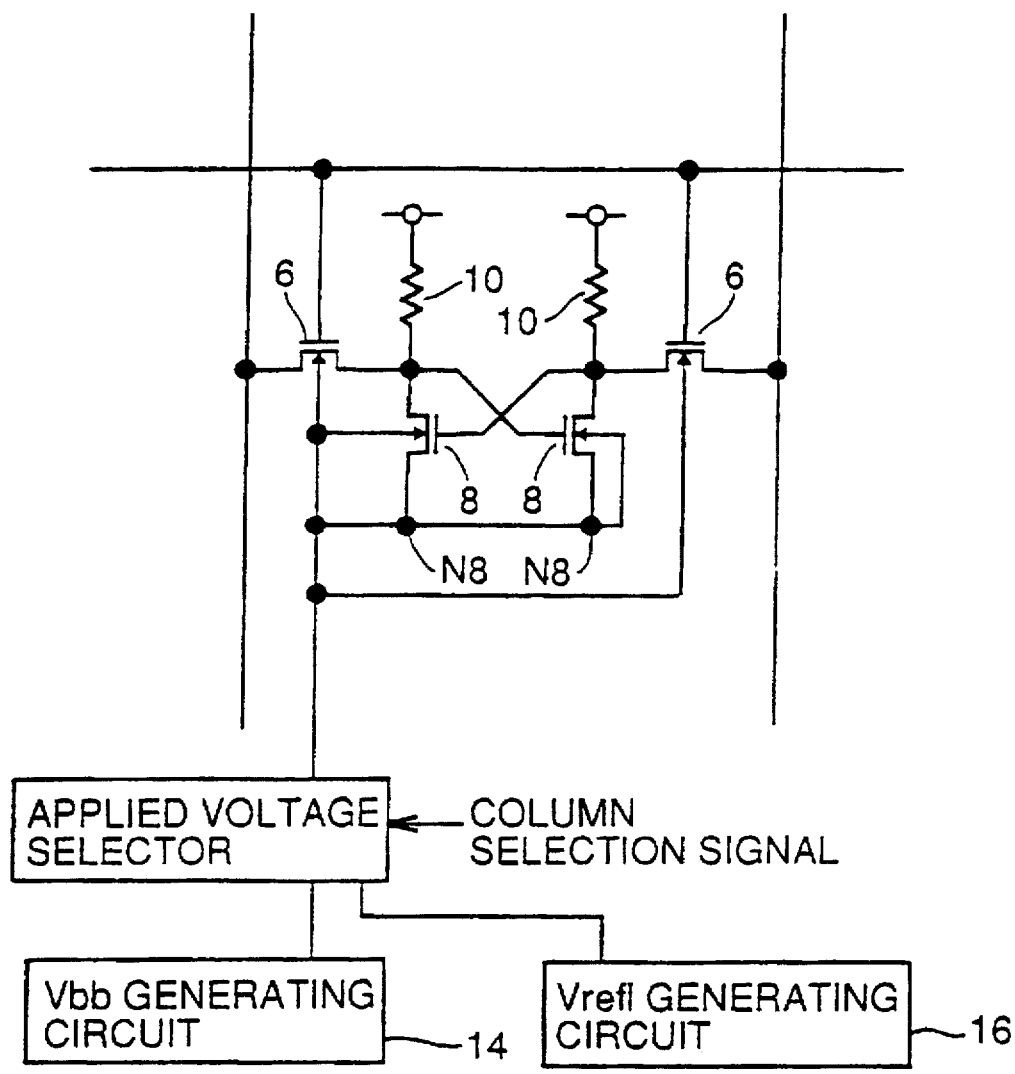
FIG. 14 is a diagram showing a single SRAM cell equivalent to that shown in FIG. 13.

FIG. 13 is a diagram showing a structure of a semiconductor memory device in accordance with a third embodiment of the present invention, and FIG. 14 is a diagram showing a single SRAM cell equivalent to each of SRAM cells constituting an SRAM cell array shown in FIG. 13.

As shown in these figures, the semiconductor memory device in accordance with the third embodiment of the present invention has a structure similar to that of the semiconductor memory device in accordance with the second embodiment shown in FIG. 8 except that each of applied voltage selectors 11, 12 and 13 is further connected to respective source nodes N8 of driver transistors of SRAM cells in a corresponding column.

In addition, the operation of the semiconductor memory device in accordance with the third embodiment is similar to that of the semiconductor memory device in accordance with the second embodiment, but as can be seen from the connection described above, a reference voltage Vref1 is supplied to respective backgates of access transistors 6 and respective backgates and source nodes N8 of driver transistors 8 of SRAM cells in a selected column, and a substrate voltage Vbb is supplied to respective backgates of access transistors 6 and respective backgates and source nodes N8 of driver transistors 8 of SRAM cells in a non-selected column (where Vref1>Vbb).

Figure 15:
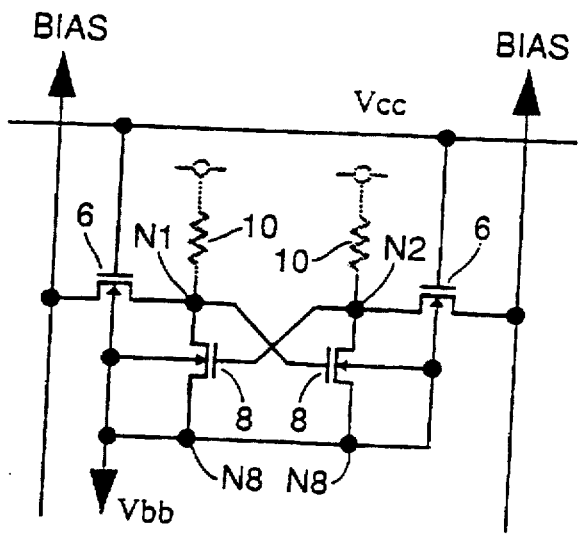
FIG. 15 is a diagram showing a state of an SRAM cell in a non-selected column at the time when a word line at the time connected thereto is activated in the semiconductor memory device shown in FIG. 13.
Figure 16:
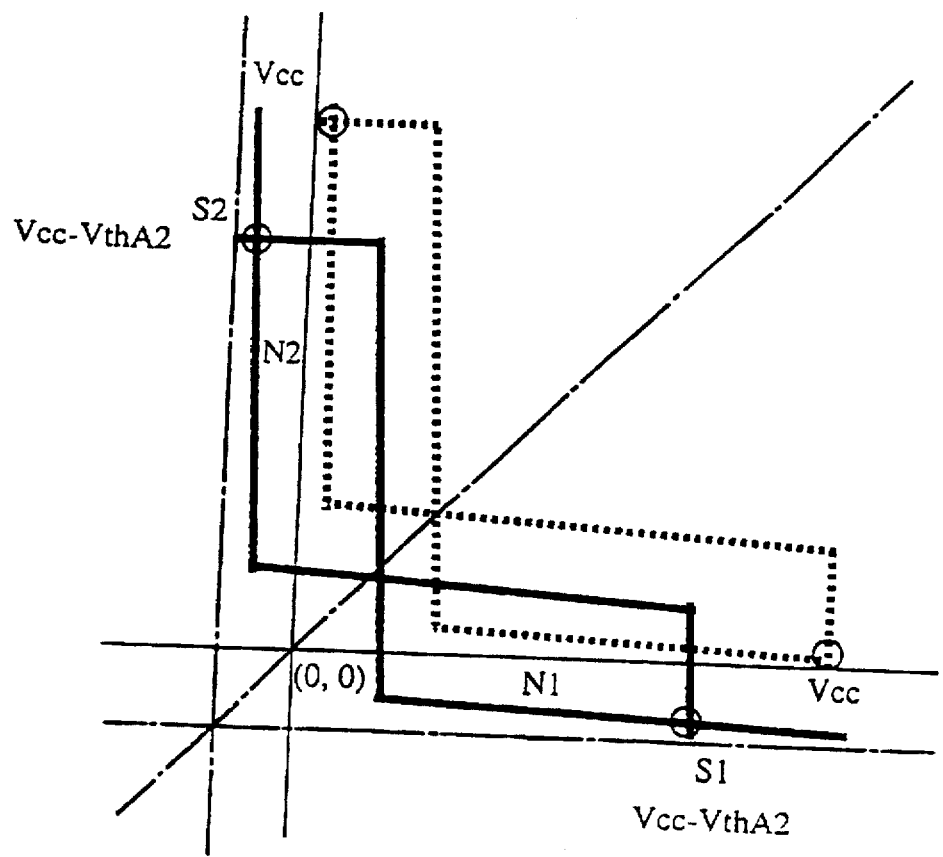
FIG. 16 is a diagram showing transmission characteristics of an SRAM cell being in the state shown in FIG. 15.

FIG. 15 is a diagram showing a state of an SRAM cell in a non-selected column at the time when a word line connected thereto is activated in accordance with the third embodiment, and FIG. 16 is a diagram showing transmission characteristics in the state of FIG. 15.

As shown in FIG. 15, respective potentials on a backgate and a source node N8 of driver transistor 8 are made to be the same, the magnitude of a threshold voltage of this driver transistor 8 is approximately the same as that of driver transistor 8 which is obtained when a ground voltage is applied to both the backgate and the source node N8. In addition, as shown by a solid line of FIG. 16, a substrate voltage Vbb is applied to the source node N8 of driver transistor 8 and a potential thereon is reduced, whereby a static noise margin is very large when a power supply voltage is low, so that data can be retained stably. It is noted that a broken line of FIG. 16 indicates transmission characteristics at the time when access transistor 6 is off.

Figure 17:
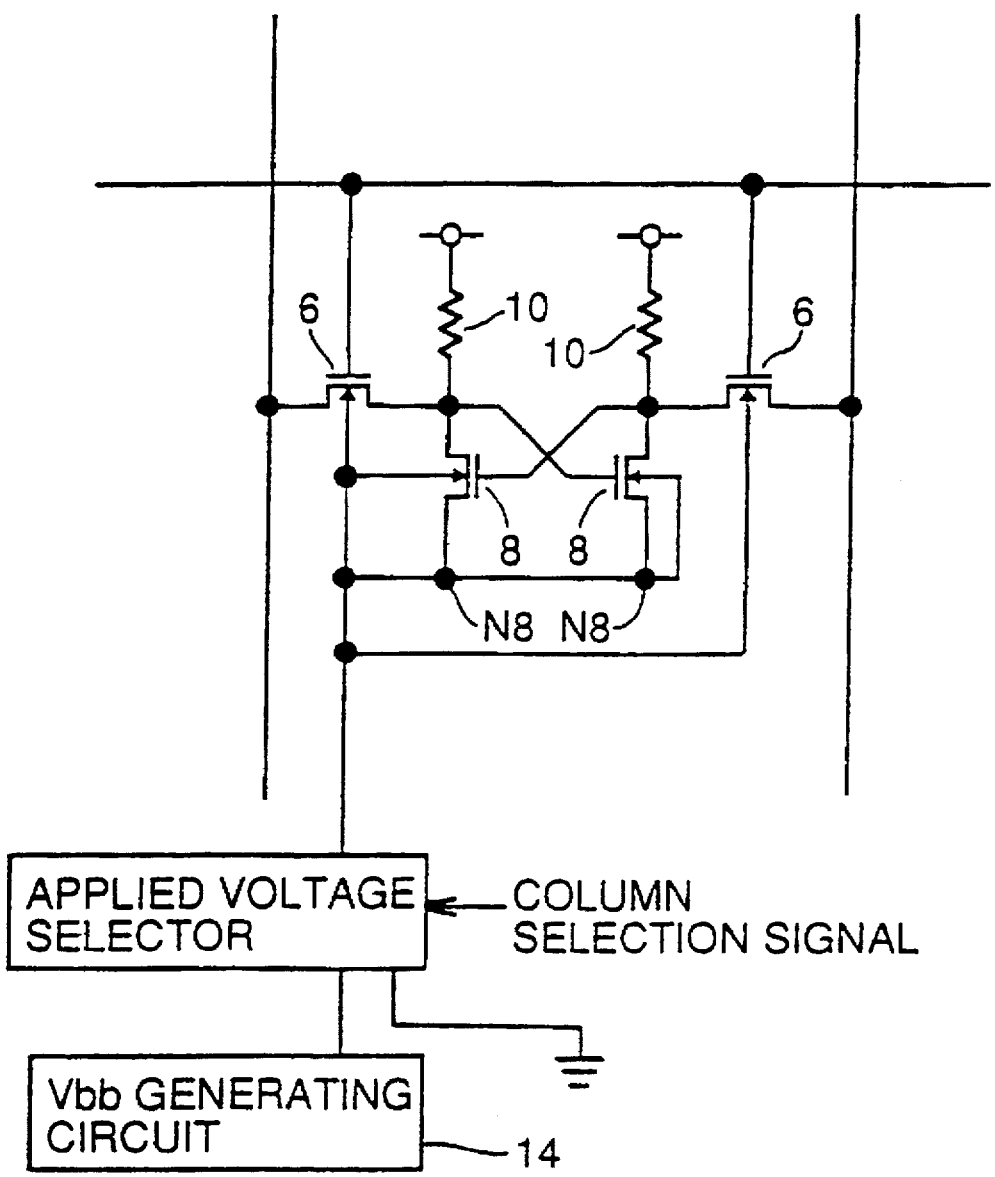
FIG. 17 is a diagram showing a structure of an SRAM cell using a ground voltage instead of a reference voltage Vref1 of FIG. 14.
Figure 18:
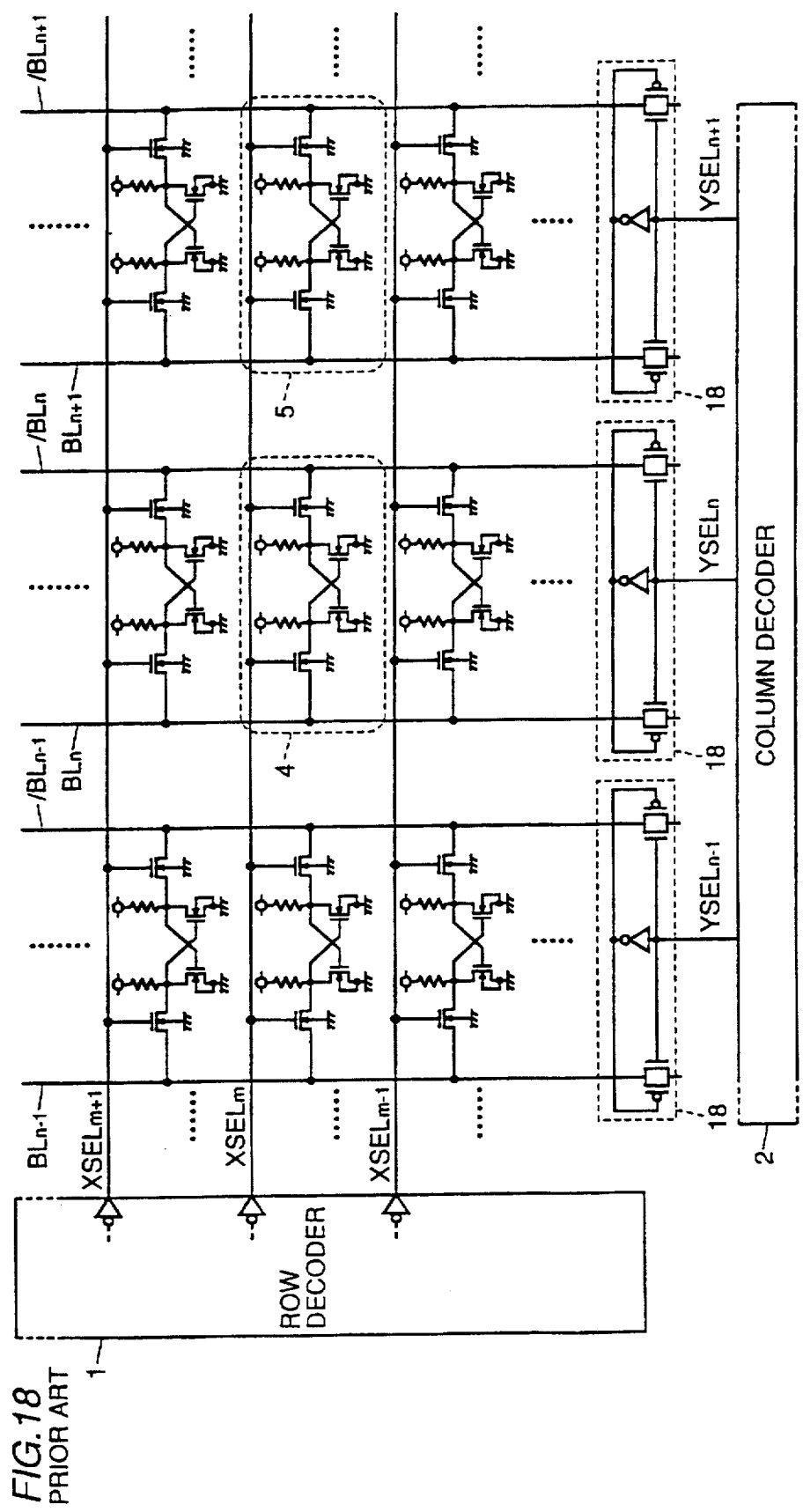
FIG. 18 is a diagram showing a structure of a conventional semiconductor memory device having an SRAM cell array.
Figure 19:
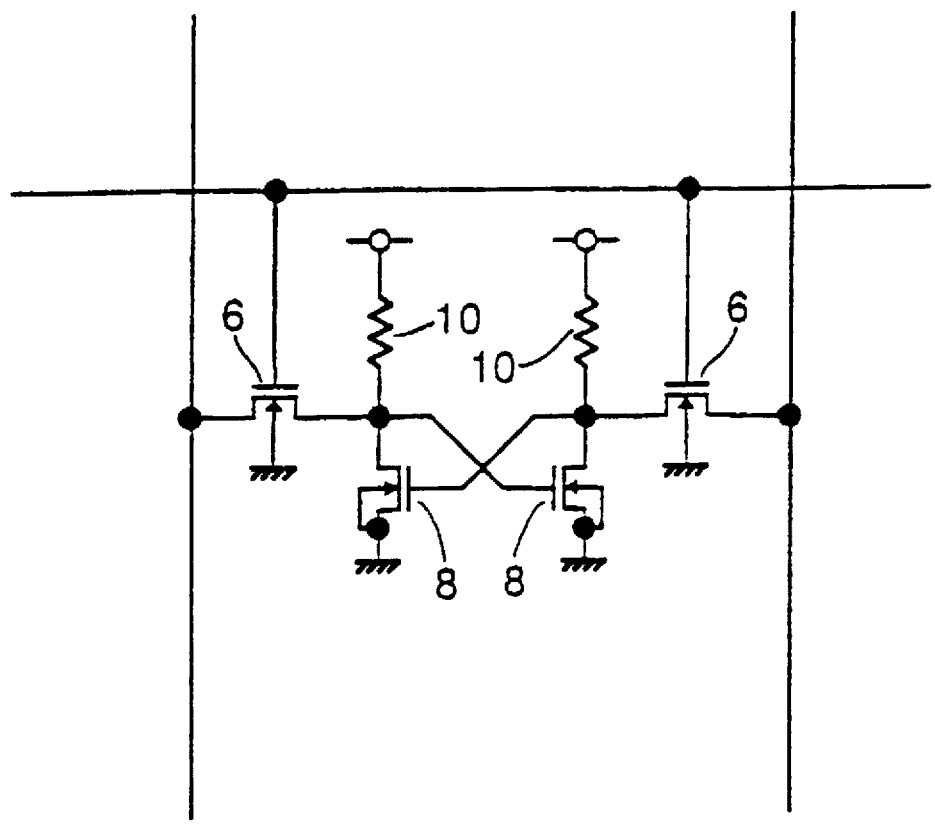
FIG. 19 is a circuit diagram showing a single SRAM cell constituting the SRAM cell array shown in FIG. 18.
Figure 20:
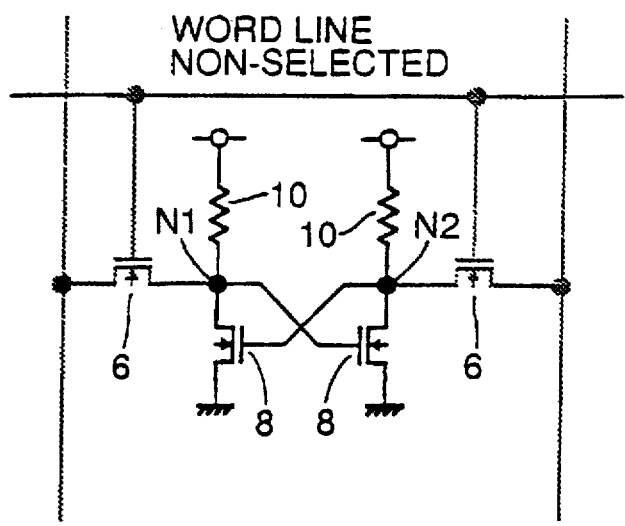
FIG. 20 is a diagram showing a state of an SRAM cell at the time when a corresponding word line is in a non-selected state in the semiconductor memory device shown in FIG. 18.
Figure 21:
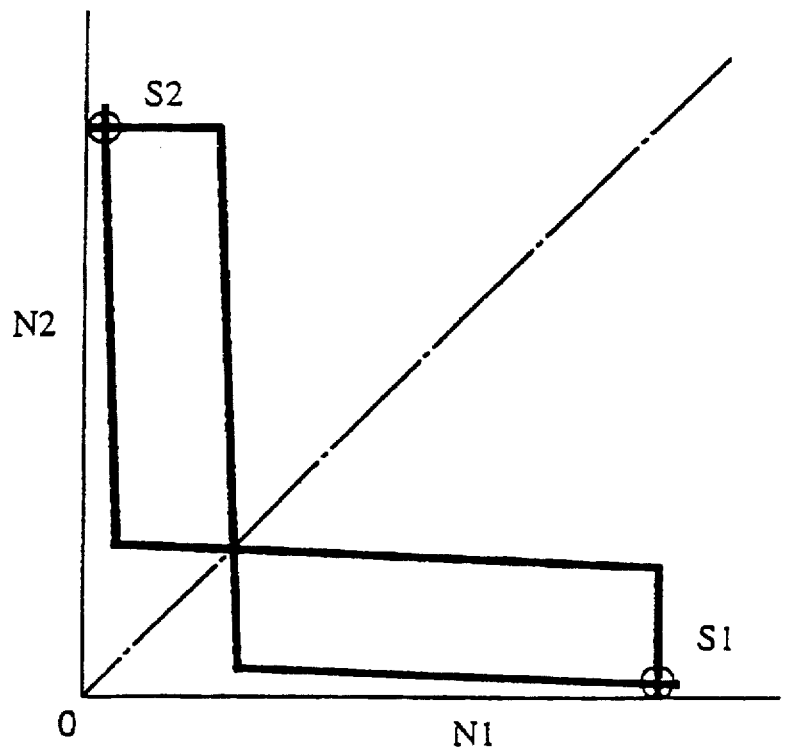
FIG. 21 is a diagram showing transmission characteristics of an SRAM cell being in the state shown in FIG. 20.
Figure 22:
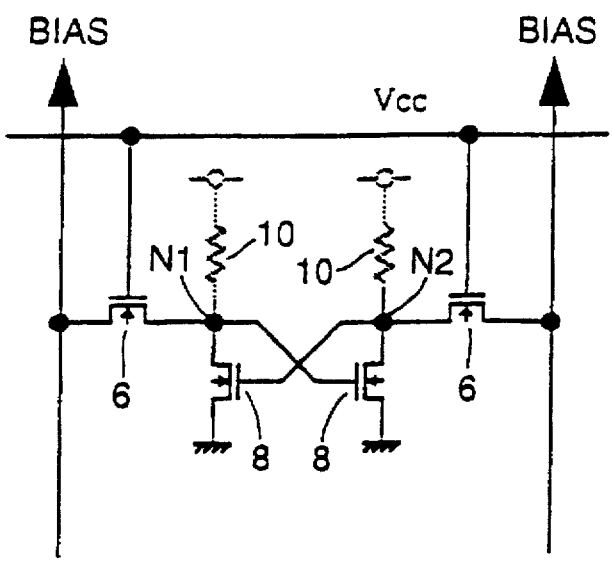
FIG. 22 is a diagram showing a state of an SRAM cell at the time when a corresponding word line is in a selected state in the semiconductor memory device shown in FIG. 18.
Figure 23:
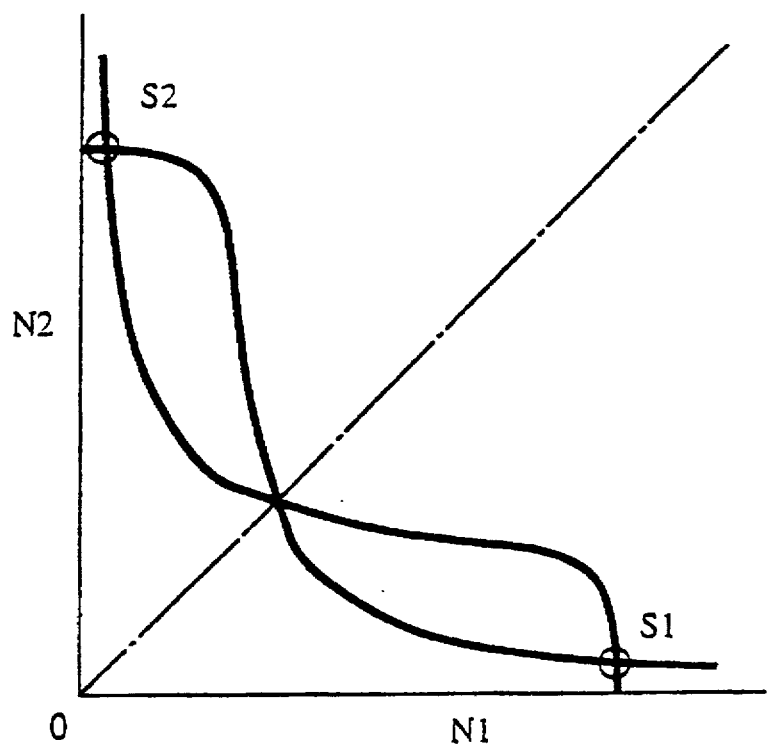
FIG. 23 is a diagram showing transmission characteristics of an SRAM cell being in the state shown in FIG. 22.

Furthermore, as in the case of the first and the second embodiments, a ground voltage may be used instead of the reference voltage Vref1 described in the third embodiment, as shown in FIG. 17.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

a static memory cell array having a plurality of columns;

column selecting means for selecting one of said columns of said static memory cell array;

substrate voltage generating means for generating a substrate voltage;

reference voltage generating means for generating a reference voltage; and voltage supplying means for supplying said reference voltage to a backgate of an access transistor in each static memory cell constituting the selected column and supplying said substrate voltage to a backgate of an access transistor in each static memory cell constituting non-selected columns.

2. A semiconductor memory device, comprising:

a plurality of word lines;

a plurality of bit line pairs intersecting said word lines;

a plurality of static memory cells provided corresponding to respective intersections of said word lines and said bit line pairs, each static memory cell including first and second access transistors and first and second driver transistors;

a column decoder responsive to a column address signal for generating a plurality of column selection signals respectively corresponding to said bit line pairs;

a plurality of column select gates respectively provided corresponding to said bit line pairs, each column select gate being connected to a corresponding bit line pair and responsive to a corresponding activated column selection signal for being turned on;

substrate voltage generating means for generating a substrate voltage;

reference voltage generating means for generating a reference voltage; and a plurality of voltage supplying means respectively provided corresponding to said bit line pairs, each voltage supplying means being responsive to a corresponding column selection signal applied to a corresponding column select gate for supplying said reference voltage to respective backgates of said first and said second access transistors in said each static memory cell connected to a corresponding bit line pair when said column selection signal is activated, and supplying said substrate voltage to respective backgates of said first and said second access transistors in said each static memory cell connected to said corresponding bit line pair when said column selection signal is deactivated.

3. The semiconductor memory device in accordance with claim 2, wherein said substrate voltage generating means generates such a substrate voltage that respective threshold voltages of said first and said second access transistors become larger than a boosted voltage required to activate said word lines when supplied to respective backgates of said first and said second access transistors.

4. The semiconductor memory device in accordance with claim 2, wherein each of said voltage supplying means further supplies said reference voltage to respective backgates of said first and said second driver transistors in said each static memory cell when said column selection signal is activated, and supplies said substrate voltage to respective backgates of said first and said second driver transistors in said each static memory cell when said column selection signal is deactivated.

5. The semiconductor memory device in accordance with claim 3, wherein each of said voltage supplying means further supplies said reference voltage to respective backgates of said first and said second driver transistors in said each static memory cell when said column selection signal is activated, and supplies said substrate voltage to respective backgates of said first and said second driver transistors in said each static memory cell when said column selection signal is deactivated.

6. The semiconductor memory device in accordance with claim 4, wherein each of said voltage supplying means further supplies said reference voltage to respective source nodes of said first and said second driver transistors in said each static memory cell when said column selection signal is activated, and supplies said substrate voltage to respective source nodes of said first and said second driver transistors in said each static memory cell when said column selection signal is deactivated.

7. The semiconductor memory device in accordance with claim 5, wherein each of said voltage supplying means further supplies said reference voltage to respective source nodes of said first and said second driver transistors in said each static memory cell when said column selection signal is activated, and supplies said substrate voltage to respective source nodes of said first and said second driver transistors in said each static memory cell when said column selection signal is deactivated.

8. The semiconductor memory device in accordance with claim 2, wherein said reference voltage generating means generates a ground voltage.

9. The semiconductor memory device in accordance with claim 3, wherein said reference voltage generating means generates a ground voltage.

10. The semiconductor memory device in accordance with claim 4, wherein
   said reference voltage generating means generates a ground voltage.

11. The semiconductor memory device in accordance with claim 5, wherein
   said reference voltage generating means generates a ground voltage.

12. The semiconductor memory device in accordance with claim 6, wherein
   said reference voltage generating means generates a ground voltage.

13. The semiconductor memory device in accordance with claim 7, wherein
   said reference voltage generating means generates a ground voltage.

* * * * *